United States Patent [19]
Lynch et al.

[11] Patent Number: 5,466,635
[45] Date of Patent: Nov. 14, 1995

[54] PROCESS FOR MAKING AN INTERCONNECT BUMP FOR FLIP-CHIP INTEGRATED CIRCUIT INCLUDING INTEGRAL STANDOFF AND HOURGLASS SHAPED SOLDER COATING

[75] Inventors: Brian Lynch, Milpitas; Patrick O'Brien, Palo Alto, all of Calif.

[73] Assignee: LSI Logic Corporation, Milpitas, Calif.

[21] Appl. No.: 252,691

[22] Filed: Jun. 2, 1994

[51] Int. Cl.⁶ .................. H01L 21/283; H01L 21/441
[52] U.S. Cl. ......................... 437/183; 228/180.22
[58] Field of Search ............... 437/183; 228/180.22; 257/737, 738, 779, 781

[56] References Cited

U.S. PATENT DOCUMENTS

| | | |
|---|---|---|
| 4,427,715 | 1/1984 | Harris . |
| 4,545,610 | 10/1985 | Lakritz et al. . |
| 4,818,728 | 4/1989 | Rai et al. . |
| 5,014,111 | 5/1991 | Tsuda et al. . |
| 5,075,965 | 12/1991 | Carey et al. . |
| 5,134,460 | 7/1992 | Brady et al. . |
| 5,147,084 | 9/1992 | Behun et al. . |
| 5,154,341 | 10/1992 | Melton et al. . |
| 5,233,504 | 8/1993 | Melton et al. . |
| 5,272,376 | 12/1993 | Ueno . |
| 5,349,500 | 9/1994 | Casson et al. ............ 361/749 |

FOREIGN PATENT DOCUMENTS

| | | |
|---|---|---|
| 63-174337 | 7/1988 | Japan . |
| 177948 | 3/1989 | Japan . |
| 25540 | 1/1990 | Japan . |
| 2177540 | 7/1990 | Japan . |
| 562979 | 3/1993 | Japan . |
| 5129303 | 5/1993 | Japan . |
| 5206139 | 8/1993 | Japan . |

Primary Examiner—Olik Chaudhuri
Assistant Examiner—David E. Graybill
Attorney, Agent, or Firm—Poms, Smith, Lande & Rose

[57] ABSTRACT

An interconnect bump is formed on a substrate structure of a flip-chip microelectronic integrated circuit by sputtering a metal base layer on the substrate, and then forming a copper standoff on the base layer. A solder cap is formed on the standoff having a peripheral portion that extends laterally external of the standoff. The peripheral portion of the cap is used as a self-aligned mask for a photolithographic step that results in removing the metal base layer except under the standoff and the cap. The cap has a lower melting point than the standoff. Heat is applied that is sufficient to cause the cap to melt over and coat the standoff and insufficient to cause the standoff to melt. The peripheral portions of the cap and the base layer that extend laterally external of the standoff cause the melted solder to form into a generally hourglass shape over the standoff due to surface tension.

7 Claims, 4 Drawing Sheets

PROCESS FOR MAKING AN INTERCONNECT BUMP FOR FLIP-CHIP INTEGRATED CIRCUIT INCLUDING INTEGRAL STANDOFF AND HOURGLASS SHAPED SOLDER COATING

BACKGROUND OF THE INVENTION

1. Field of the Invention

The present invention generally relates to the art of microelectronic integrated circuit fabrication, and more specifically to a flip-chip integrated circuit comprising a plurality of interconnect bumps, each including an integral standoff and an hourglass shaped solder coating.

2. Description of the Related Art

The "flip-chip" type of integrated circuit interconnection enables a substantial increase in the number and density of interconnections that can be made between an integrated circuit chip and a supporting printed circuit board (PCB) by eliminating wire bonds therebetween. The flip-chip configuration is also applicable to interconnectably mounting one chip on another chip.

A flip-chip mounting and interconnect system that is known as C4 controlled collapse connection is described, for example, in U.S. Pat. No. 4,545,610, entitled "METHOD FOR FORMING ELONGATED SOLDER CONNECTIONS BETWEEN A SEMICONDUCTOR DEVICE AND A SUPPORTING SUBSTRATE", issued Oct. 8, 1985 to Mark Lakritz et al.

In this system, an electrically conductive "bump" is formed on each external connection or bond pad of an interconnect metallization pattern on the chip. A conjugate set of bumps is formed on the PCB. The chip is placed face down on the PCB with the bumps pressed together. Solder that is coated on either or both sets of bumps is heated and caused to reflow, and provide ohmic connection between the sets of bumps.

In the basic C4 system, however, since the bumps are formed of solder, they tend to collapse under applied pressure during reflow, creating a pancake shape that tends to concentrate thermal stresses on the solder bonds. The various materials of which the integrated circuit chip is fabricated have different coefficients of thermal expansion. During thermal cycling such as typically experienced by the circuit during operation, the different materials expand and contract at different rates. This mismatch creates stresses that produce fatigue within the solder bonds and can result in catastrophic failure of the interconnections.

For this reason, rigid spacers or standoffs are conventionally provided between the chip and the PCB or other structure on which the chip is mounted. The standoffs are typically metal spheres having a diameter approximately equal to the desired spacing between the chip and the support.

The standoffs relieve a large part of the thermal stresses applied to the solder bonds. However, their provision requires additional complicated process steps, and care must be taken to ensure that the standoffs do not become loose and short out portions of the circuit.

An improvement to the basic flip-chip bump interconnect system is disclosed in U.S. Pat. No. 5,154,341, entitled "NONCOLLAPSING MULTISOLDER INTERCONNECTION", issued Oct. 13, 1992 to Cynthia Melton et al. In this system, relatively rigid bumps of a high temperature solder are formed on the interconnect metallization pattern of a flip-chip integrated circuit, and balls of soft, low temperature solder are formed on conjugate bonding pads of the PCB. The chip is positioned and pressed against the PCB with the bumps spaced closely adjacent to the solder balls.

Heat is applied to reflow the solder, such that the low temperature solder from the ball coats the high temperature solder bump. Due to the geometry of the configuration, the solder coating assumes an hourglass shape that, in combination with the relatively rigid high temperature solder bump that functions as a standoff, relieves thermal stresses on the solder bond.

Although providing a desirable interconnect configuration, the method disclosed by Melton is disadvantageous in that the bump and solder ball must be formed separately, and precise alignment must be provided such that the bump and the ball are laterally spaced from each other by the correct distance.

SUMMARY OF THE INVENTION

It is an object of the present invention to provide a method of fabricating a flip-chip microelectronic integrated circuit comprising a plurality of interconnect bumps, each of which includes an integral standoff and an hourglass shaped solder or indium coating.

In accordance with present method, an interconnect bump is formed on a substrate of a flip-chip microelectronic integrated circuit by sputtering a metal base layer on the substrate, and then forming a copper standoff on the base layer. A solder cap is formed on the standoff having a peripheral portion that extends laterally external of the standoff.

The peripheral portion of the cap is used as a self-aligned mask for a photolithographic step that results in removing the metal base layer except under the standoff and the cap. The cap has a lower melting point than the standoff. Heat is applied that is sufficient to cause the cap to melt over and coat the standoff and insufficient to cause the standoff to melt.

The peripheral portions of the cap and the base layer that extend laterally external of the standoff cause the melted solder to form into a generally hourglass shape over the standoff due to surface tension.

It is another object of the invention to provide an interconnect bump that is fabricated using the present method, and a flip-chip integrated circuit comprising a plurality of these bumps.

The above and other objects, features and advantages of the present invention will become apparent to those skilled in the art from the following detailed description taken with the accompanying drawings, in which like reference numerals refer to like parts.

DETAILED DESCRIPTION OF THE INVENTION

Figure 1:
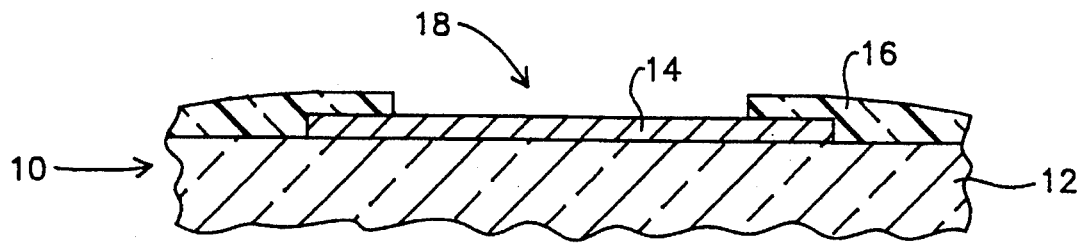
FIGS. 1 to 7 are simplified sectional views illustrating a method of fabricating an interconnect bump for a flip-chip microelectronic integrated circuit in accordance with the present invention.

Referring to FIG. 1, a flip-chip integrated chip or circuit 10 embodying the present invention comprises a substrate structure 12, which includes an electrically conductive metallization pattern that interconnects the various functional elements of the circuit 10. The metallization pattern includes an aluminum interconnect or bond pad 14 for providing external interconnection of a corresponding electrical point of the circuit 10 to a printed circuit board or other structure (not shown) on which the circuit 10 is to be mounted.

The substrate structure 12 typically includes a monocrystalline silicon substrate, although the invention is not so limited, and the substrate can be formed of gallium arsenide or other suitable semiconductive material. A passivation layer 16, typically formed of an oxide or nitride of silicon, protectively encapsulates the substrate structure 12 and its interconnect metallization pattern.

An opening 18 is formed through the passivation layer 16 to expose the bond pad 14. In a preferred embodiment of the invention, the passivation layer 16 is formed of silicon dioxide to a thickness of approximately 1 μm.

Figure 2:
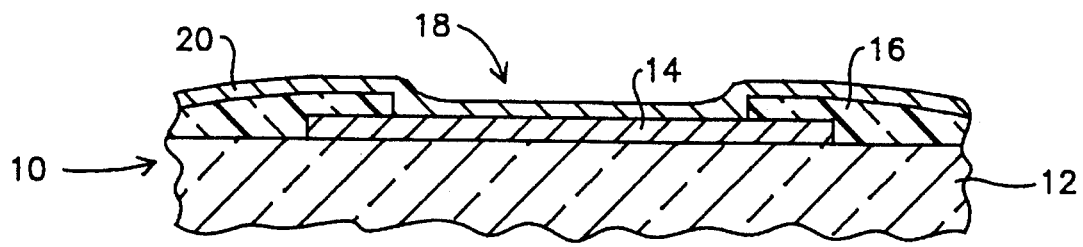

In the next step of the method as illustrated in FIG. 2, a metal base layer 20 is sputtered or otherwise formed over the passivation layer 16 and the bond pad 14. Although not explicitly illustrated, the base layer 20 preferably includes a barrier sublayer for preventing diffusion of copper into the aluminum bonding pad 14, and/or an electrode sublayer for use in subsequent electroplating steps as will be described in detail below.

The barrier sublayer is approximately 100–5,000 Å thick, and preferably comprises titanium, titanium/tungsten or titanium/copper. The electrode sublayer is formed over the barrier sublayer, has a thickness in the same range as the barrier sublayer, and preferably comprises copper or gold.

Figure 3:
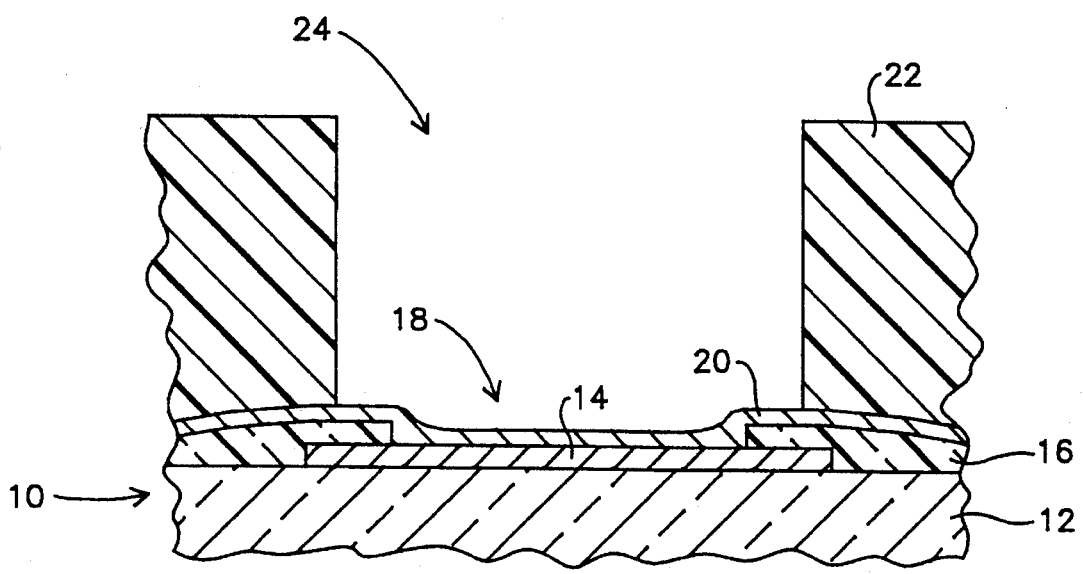

In FIG. 3, a positive photoresist layer 22 is formed to a thickness of approximately 20–60 μm on the base layer 20, and is exposed in an area centered on the bond pad 14 and developed to form a hole 24 therethrough.

Figure 4:
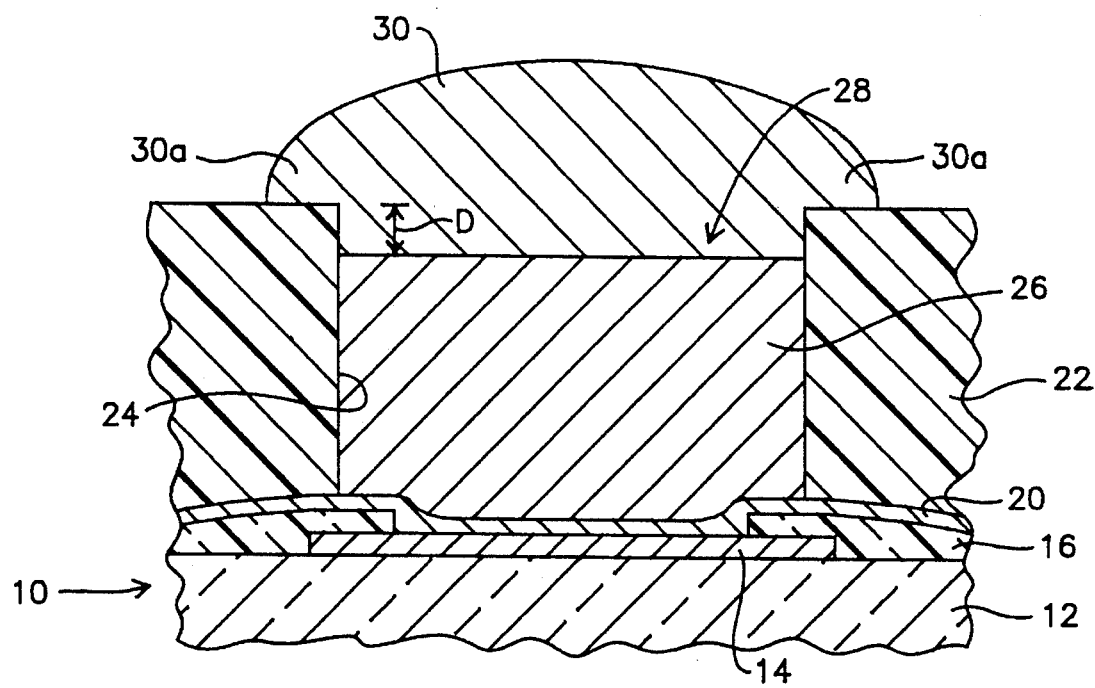

As illustrated in FIG. 4, a standoff 26 of a relatively rigid material, preferably copper or gold, is formed in the hole 24 by electroplating using the electrode sublayer of the base layer 20 as an electrode. The standoff 26 is formed to a thickness or height above the base layer 20 that is smaller than the thickness of the photoresist layer 22, such that a recess 28 is formed in the hole 24 above the standoff 26.

The recess 28 has a depth D that is preferably on the order of 5 μm. A cap 30 is electroplated, deposited or otherwise formed on top of the standoff 26. The thickness of the cap 30, typically 30 μm, is larger than the depth D of the recess 28 such that the cap 30 extends above the photoresist layer 22. In addition, a peripheral portion 30a of the cap 30 overflows from the recess 28 and extends laterally external of the standoff 26 over the photoresist layer 22.

The cap 30 is made of a material, preferably solder, that has a lower melting point than the material of the standoff 26. Solders in the range of lead/tin=$^{90}\!/_{10}$ to $^{97}\!/_{3}$ are suitable for practicing the invention. The cap 30 need not be formed of solder, however. Other suitable materials include, for example, indium.

Figure 5:
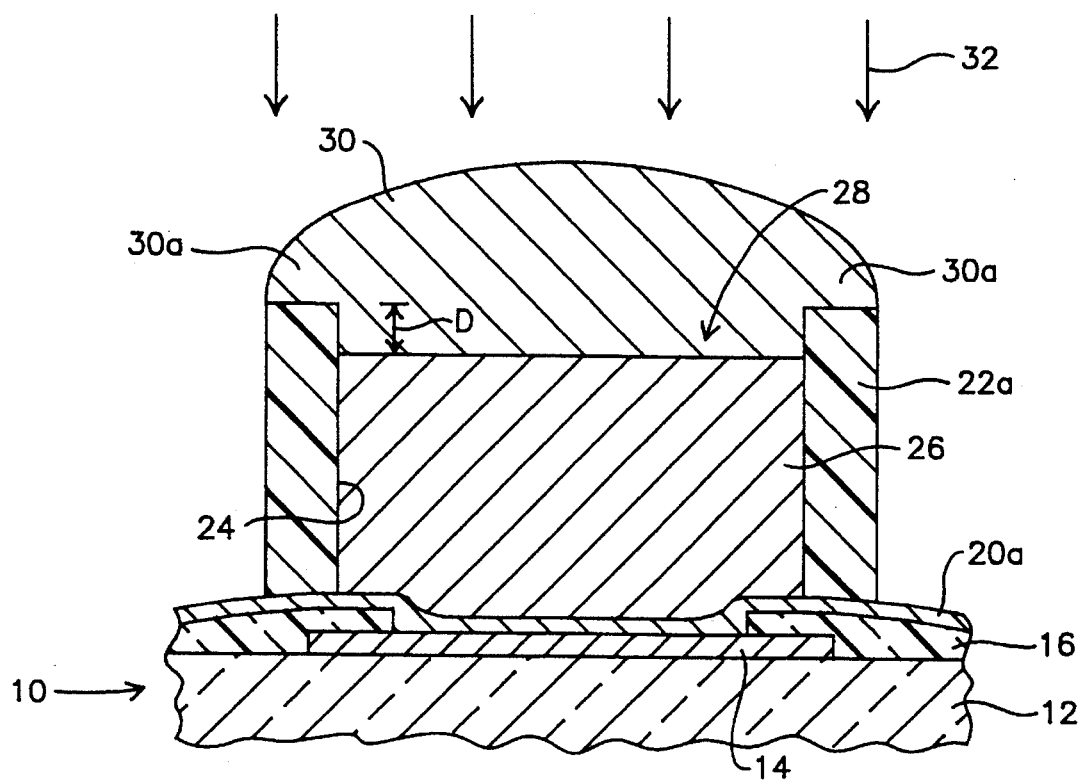

As illustrated in FIG. 5, the photoresist layer 22 is uniformly exposed as indicated by arrows 32, and then developed. Since the photoresist layer 22 is of the positive type, the developer removes the areas thereof that were exposed. In accordance with an important feature of the invention, the peripheral portion 30a of the cap 30 serves as a self-aligned mask that "shades" the underlying area of the photoresist layer 22 and prevents it from being exposed. This causes a tubular photoresist section 22a to be formed around the standoff 26 and under the peripheral portion 30a of the cap 30.

Figure 6:
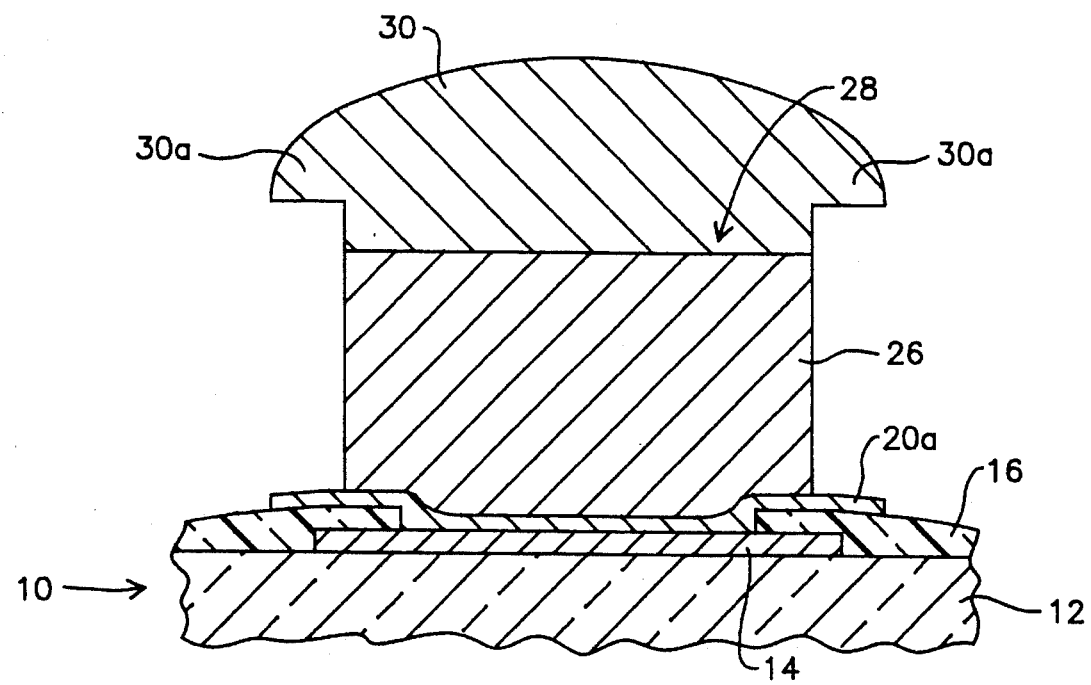

In the next step of the method as illustrated in FIG. 6, the base layer 20 is etched away except under the photoresist section 22a using a conventional etchant that does not etch the material of the photoresist layer 22. This results in a base 20a being formed under the standoff 26 and the photoresist section 22a that extends laterally external of the standoff 26 and has the same profile as the cap 30. The photoresist section 22a is then stripped or dissolved away to expose the base 20a and the walls of the standoff 26 and cap 30.

Figure 7:
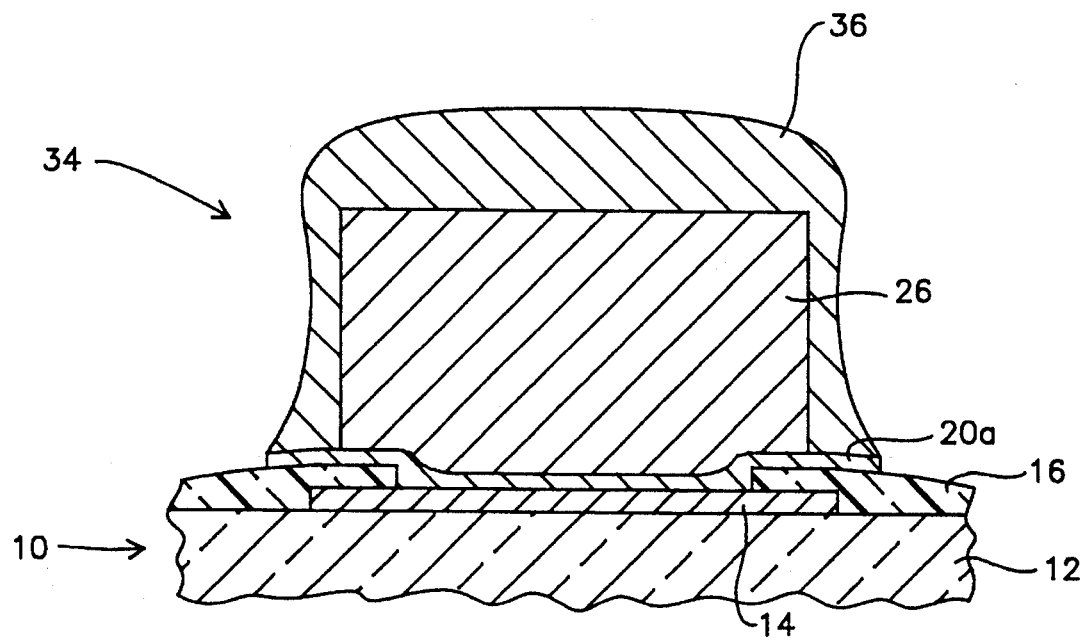

As illustrated in FIG. 7, heat is applied to melt or fluidize the cap 30 and cause it to reflow over and coat the walls the standoff 26 and the portion of the base 20a that extends laterally external of the standoff 26. The applied temperature is selected to be higher than the melting point of the cap 30, but lower than the melting point of the standoff 26.

Where the cap 30 is formed of solder and the standoff 30 is formed of copper, a suitable reflow temperature is in the range of approximately 300°–350° C. Where the cap 30 is formed of indium, a suitable reflow temperature is approximately 200° C. The reflow step can be performed in an air ambient, or in an organic or reducing ambient including, for example, hydrogen gas. As another alternative in accordance with the invention, a layer of flux (not shown) can be coated on the structure prior to reflow.

The materials of the base 20a, standoff 26 and cap 30 are selected such that the base 20a and standoff 26 are "wetted" by the material of the cap 30 when the cap 30 is in its fluid state.

The thickness of the cap 30, the lateral extension of the peripheral portion 30a and the lateral extension of the base 20a external of the standoff 26 are selected such that the cap 30 forms a generally "hourglass" shape as illustrated in FIG. 7 upon reflow thereof in which at least the lower portion of the cap 30 that flows over the base 20a flares outwardly.

These dimensions can be determined theoretically or empirically such that the surface tension which is present during the reflow step causes the cap 30 to flow over and coat the standoff 26 and base 20a, and attain the desired shape.

The structure of FIG. 7 constitutes an interconnect bump 34 embodying the present invention, including the rigid standoff 26 and a solder coating 36 that results from reflow of the cap 30.

The solder coating 36 provides an environmental seal for the standoff 26, and the hourglass shape of the coating 36 in combination with the integral standoff 26 provide relief from thermal stresses imposed on the resulting interconnect bond that are induced by thermal cycling during operation of the integrated circuit 10.

Since the standoff 26 and solder coating 36 are formed integrally on the substrate structure 12, the prior art problems of loose standoffs causing short circuits and alignment of separate standoffs and solder balls are eliminated.

Figure 8:
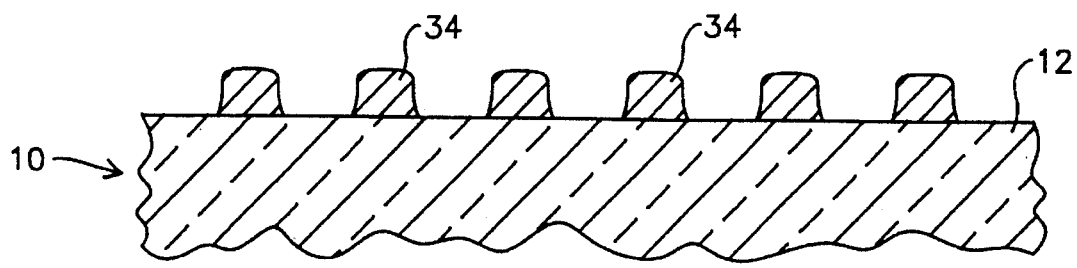
FIG. 8 is a simplified sectional view illustrating a flip-chip integrated circuit comprising a plurality of bumps fabricated using the method of FIGS. 1 to 7.

FIG. 8 illustrates the present flip-chip integrated circuit 10 including a plurality of interconnect bumps 34 formed thereon. The illustrated structure constitutes a product that is ready to be interconnectably mounted on a printed circuit board (PCB) or other structure.

Figure 9:
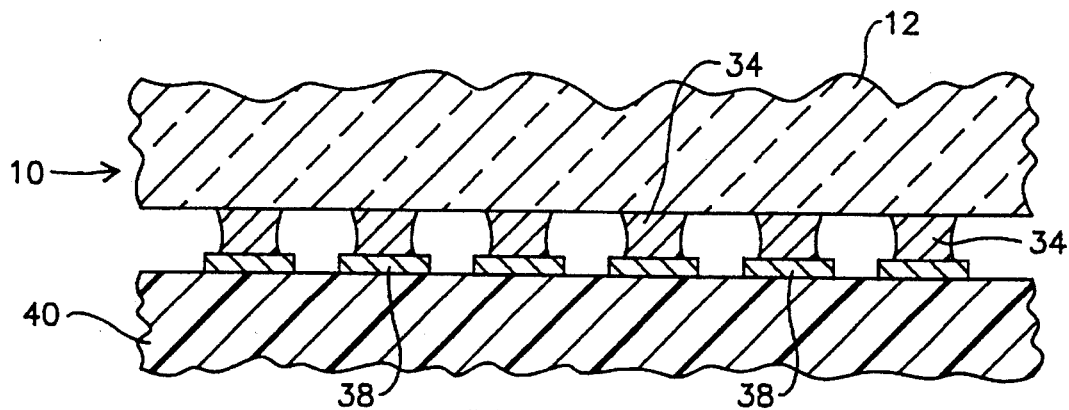
FIG. 9 is a simplified sectional view illustrating the integrated circuit of FIG. 8 mounted on a printed circuit board.

FIG. 9 illustrates the present integrated circuit 10 as mounted on a PCB 40. This is accomplished by aligning the circuit 10 face down on the PCB 40 such that the bumps 34 are pressed into contact with conjugate bumps or bond pads 38 on the PCB 40. Heat is then applied to melt the solder coatings 36 of the bumps 34 and cause the solder to reflow. During this process, the solder coatings 36 flow onto the bond pads 38 and attain a desirable hourglass shape that flares outwardly at both ends of the bumps 34.

Figure 10:
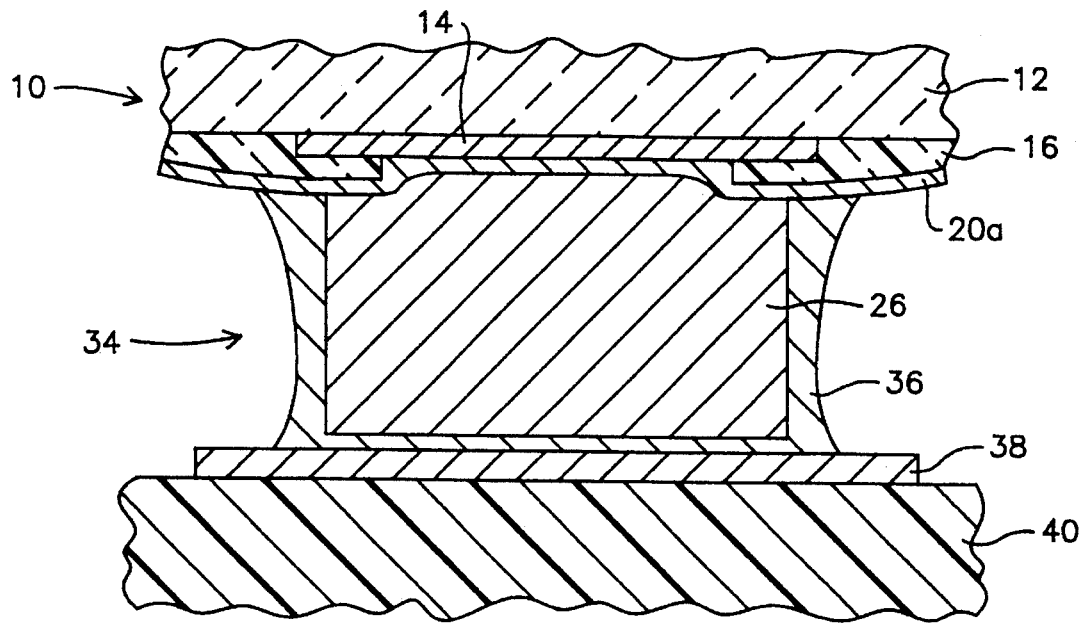
FIG. 10 is a simplified sectional view, to enlarged scale, illustrating one bump of the assembly of FIG. 9 and its interconnection to a bonding pad on the printed circuit board.

As illustrated in FIG. 10, the reflowed solder flows onto the bond pad 38 and, when the heat is removed, forms a metallurgical bond between the bond pads 14 of the chip 10 and the bond pads 38 of the PCB 40 via the standoffs 26 and solder coatings 36.

Various modifications will become possible for those skilled in the art after receiving the teachings of the present disclosure without departing from the scope thereof.

We claim:

1. A method of fabricating an interconnect bump on a substrate structure, comprising the steps of:
    (a) forming a standoff on the substrate structure;
    forming a cap on the standoff having a peripheral portion that extends laterally external of the standoff, the cap having a lower melting point than the standoff:
    (c) applying heat that is sufficient to cause the cad to melt over and coat the standoff and insufficient to cause the standoff to melt; and
    (d) prior to step (c), forming a base under the standoff having a peripheral portion that extends laterally external of the standoff, the base being wetted by the cap in step (c);
    in which step (d) comprises the substeps of:
    (e) forming a base layer on the substrate structure;
    (f) forming a photoresist section on a portion of said base layer corresponding to said peripheral portion of the base using said peripheral portion of the cap as a self-aligned mask;
    (g) removing said base layer except under said photoresist section to form the base; and
    (h) removing said photoresist section.

2. A method as in claim 1, in which steps (a) and (b) comprise forming the standoff and the cap respectively of materials such that the standoff is wetted by the cap in step (c).

3. A method as in claim 1, in which step (b) comprises forming said peripheral portion such that the cap melts over the standoff into a generally hourglass shape in step (c).

4. A method as in claim 1, in which:
    step (f) comprises the substeps, performed prior to step (a), of:
    (i) forming a photoresist layer on said base layer; and
    (j) forming a hole through said photoresist layer;
    step (a) comprises forming the standoff in said hole;
    step (b) comprises forming the cap on the standoff such that said peripheral portion of the cap extends over said photoresist layer;
    step (f) comprises the substeps, performed between steps (b) and (g), of:
    (m) exposing said photoresist layer using said peripheral portion of the cap as a self-aligned mask; and
    (n) developing said photoresist layer to form said photoresist section; and
    step (g) comprises etching away said base layer using an etchant that does not etch said photoresist section to form the base.

5. A method as in claim 4, in which:
    step (a) comprises forming the standoff to a thickness that is smaller than a thickness of said photoresist layer such that a recess is formed in said hole above the standoff; and
    step (b) comprises forming the cap to a thickness that is larger than a depth of said recess such that the cap extends above said hole.

6. A method of fabricating an interconnect bump on a substrate structure, comprising the steps of:
    (a) forming a standoff on the substrate structure;
    (b) forming a cap on the standoff having a peripheral portion that extends laterally external of the standoff, the cap having a lower melting point than the standoff; and
    (c) applying heat that is sufficient to cause the cap to melt over and coat the standoff and insufficient to cause the standoff to melt; and
    (d) prior to step (c), forming a base under the standoff having a peripheral portion that extends laterally external of the standoff, the base being wetted by the cap in step (c);
    in which:
    step (d) comprises the substeps of:
    (e) forming a base layer on the substrate structure;
    (f) forming a photoresist section on a portion of said base layer corresponding to said peripheral portion of the base using said peripheral portion of the cap as a self-aligned mask;
    (g) removing said base layer except under said photoresist section to form the base; and
    (h) removing said photoresist section; and
    steps (a) and (b) comprise forming the standoff and the cap of electrically conductive metals respectively that are selected such that the cap wets the standoff in step (c); and
    step (a) comprises forming the standoff of a material selected from the group consisting of copper and gold.

7. A method of fabricating an interconnect bump on a substrate structure, comprising the steps of:
    (a) forming a standoff on the substrate structure;
    (b) forming a cap on the standoff having a peripheral portion that extends laterally external of the standoff, the cap having a lower melting point than the standoff; and
    (c) applying heat that is sufficient to cause the cap to melt over and coat the standoff and insufficient to cause the standoff to melt; and
    (d) prior to step (c), forming a base under the standoff having a peripheral portion that extends laterally external of the standoff, the base being wetted by the cap in step (c);
    in which:
    step (d) comprises the substeps of:
    (e) forming a base layer on the substrate structure;
    (f) forming a photoresist section on a portion of said base layer corresponding to said peripheral portion of the base using said peripheral portion of the cap as a self-aligned mask;

(g) removing said base layer except under said photoresist section to form the base; and
(h) removing said photoresist section; and steps (a) and (b) comprise forming the standoff and the cap of electrically conductive metals respectively that are selected such that the cap wets the standoff in step (c); and step (a) comprises forming the cap of a material selected from the group consisting of solder and indium.

* * * * *